(12) United States Patent
Kobayashi

(10) Patent No.: US 9,548,718 B2
(45) Date of Patent: Jan. 17, 2017

(54) PIEZOELECTRIC VIBRATION PIECE AND PIEZOELECTRIC VIBRATOR

(71) Applicant: SII Crystal Technology Inc., Chiba-shi, Chiba (JP)

(72) Inventor: Takashi Kobayashi, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 14/833,499

(22) Filed: Aug. 24, 2015

(65) Prior Publication Data

US 2016/0094197 A1    Mar. 31, 2016

(30) Foreign Application Priority Data

Sep. 30, 2014  (JP) .................................. 2014-202012

(51) Int. Cl.
*H03H 9/21*     (2006.01)
*H01L 41/053*   (2006.01)
*H03H 9/10*     (2006.01)

(52) U.S. Cl.
CPC .............. *H03H 9/21* (2013.01); *H01L 41/053* (2013.01); *H03H 9/1021* (2013.01)

(58) Field of Classification Search
CPC ........ H03H 9/21; H03H 9/215; H03H 9/2468; H03H 9/2473; H03H 9/2484; H03H 9/2494
USPC ....................................................... 310/370
See application file for complete search history.

(56) References Cited

U.S. PATENT DOCUMENTS

| 8,760,235 B2* | 6/2014 | Yamada | H03H 9/02102 |
| | | | 310/370 |
| 2005/0062368 A1* | 3/2005 | Hirasawa | H03H 9/21 |
| | | | 310/370 |
| 2011/0068876 A1* | 3/2011 | Yamada | H03H 9/1021 |
| | | | 331/158 |
| 2011/0204985 A1* | 8/2011 | Yamada | H03H 3/02 |
| | | | 331/156 |
| 2011/0248600 A1* | 10/2011 | Yamada | H03H 9/21 |
| | | | 310/300 |
| 2012/0007684 A1* | 1/2012 | Yamada | H03H 9/02102 |
| | | | 331/156 |
| 2015/0255701 A1* | 9/2015 | Kobayashi | H01L 41/053 |
| | | | 310/344 |
| 2016/0094197 A1* | 3/2016 | Kobayashi | H03H 9/1021 |
| | | | 310/344 |

FOREIGN PATENT DOCUMENTS

| JP | 2009-118302 A | 5/2009 |
| JP | 2010-87574 A | 4/2010 |

\* cited by examiner

*Primary Examiner* — J. San Martin
(74) *Attorney, Agent, or Firm* — Brinks Gilson & Lione

(57) ABSTRACT

A piezoelectric vibration piece includes: a base portion; a pair of vibration arm portions which extends in a first (+Y) direction from the base portion, and is arranged separately in a second (X) direction intersecting with the first (+Y) direction; and a support arm portion which extends in the first (+Y) direction from the base portion. The support arm portion, includes a first arm portion formed such that a width which is a length along the second (X) direction is gradually narrowed towards a tip end portion side of the support arm portion, and a second arm portion which extends in the first (+Y) direction from the first arm portion and is formed such that the width is broadened towards the tip end portion side.

7 Claims, 9 Drawing Sheets

US 9,548,718 B2

PIEZOELECTRIC VIBRATION PIECE AND PIEZOELECTRIC VIBRATOR

RELATED APPLICATIONS

This application claims priority under 35 U.S.C. §119 to Japanese Patent Application No. 2014-202012 filed on Sep. 30, 2014, the entire content of which is hereby incorporated by reference.

BACKGROUND OF THE INVENTION

Field of the Invention

The present invention relates to a piezoelectric vibration piece and a piezoelectric vibrator.

Background Art

From the related art, in a mobile phone or a mobile information terminal device, a piezoelectric vibrator using crystal or the like has been generally adopted as a device used in a time source, a timing source of a control signal, a reference signal source, or the like. As such a piezoelectric vibrator, a piezoelectric vibrator has been known in which a piezoelectric vibration piece is hermetically sealed in a package having a cavity formed thereon.

As such a piezoelectric vibration piece, a piezoelectric vibration piece including a base portion, and a pair of vibration arms and support arms extending from the base portion has been known. In addition, a piezoelectric vibration piece is proposed in which a portion of the support arm on a base end side is formed in a tapered shape such that the width is gradually narrowed towards a tip end side, and a portion of the support arm on a tip end side is formed such that the width is broadened (refer to JP-A-2010-87574 described below).

In addition, a piezoelectric vibration piece is proposed in which a support arm includes a second linear portion which extends in parallel with an extension direction of a vibration arm from a base portion, a curved portion which is disposed to be connected to a tip end of the second linear portion and is formed to be curved, and a first linear portion which is disposed to be connected to a tip end of the curved portion and extends in parallel with the extension direction of the vibration arm (refer to JP-A-2009-118302 described below).

However, In the piezoelectric vibration piece disclosed in JP-A-2010-87574 described above, a step portion is formed in a boundary portion between the portion of the support arm on the tip end side which is formed broadly and the portion on the base end side which is formed in a tapered shape, and thus a so-called etching residue is easily generated in the step portion. For this reason, in the step portion, a crack occurs in the support arm, or the support arm is broken.

In addition, in the piezoelectric vibration piece disclosed in JP-A-2009-118302 described above, the support arm is formed to be curved, and thus an occurrence of a vibration leakage (a leakage of vibrational energy) to the package side from the piezoelectric vibration piece may not be reduced.

In addition, the width dimension of the support arm (the length of the pair of support arms in a separation direction) is constant, and thus it is not possible to sufficiently ensure a junction area of the first linear portion on a tip end side which is mounted in the package, and it is not possible to sufficiently obtain a mounting strength.

SUMMARY OF THE INVENTION

Therefore, the present invention has been made in consideration of such a situation, and an object thereof is to provide a piezoelectric vibration piece and a piezoelectric vibrator in which an occurrence of a vibration leakage is reduced while suppressing a breakage of a support arm portion, and a mounting strength increases.

In order to attain the object described above, the followings are adopted in the present invention.

According to an aspect of the present invention, there is provided an piezoelectric vibration piece, including a base portion, a pair of vibration arm portions which extends in a first direction from the base portion, and is arranged separately in a second direction intersecting with the first direction, and a support arm portion which extends in the first direction from the base portion, in which the support arm portion, includes a first arm portion formed such that a width which is a length along the second direction is gradually narrowed towards a tip end portion side of the support arm portion, and a second arm portion which extends in the first direction from the first arm portion and is formed such that the width is broadened towards the tip end portion side.

In the piezoelectric vibration piece having such a configuration, the first arm portion of the support arm portion is formed such that the width is gradually narrowed towards the tip end portion side, and thus it is possible to suppress an occurrence of a vibration leakage.

In addition, the second arm portion of the support arm portion is formed such that the width is gradually broadened towards the tip end portion side, and thus it is possible to increase the area of the second arm portion on the tip end side. Accordingly, when the tip end side of the second arm portion is mounted in the package, it is possible to increase the mounting surface area, and thus it is possible to increase the mounting strength with respect to the package of the piezoelectric vibration piece.

In addition, in the base end side of the support arm portion in which an etching residue is easily generated, that is, in the base end side of the first arm portion, the width is formed to be broader than that in the tip end side of the first arm portion. Accordingly, it is possible to ensure the strength of the base end side of the first arm portion, and thus it is possible to suppress the breakage of the support arm portion on the base end side. In addition, when a step portion or a notch is formed in the support arm portion, the etching residue is easily generated, but the support arm portion is formed such that the width is gradually changed along the first direction. Accordingly, the support arm portion prevents the etching residue from being generated along the first direction.

In the piezoelectric vibration piece according to the aspect of the present invention, it is preferable that both side surfaces of the first arm portion and the second arm portion are respectively formed in the shape of a flat surface.

In the piezoelectric vibration piece having such a configuration, the both side surfaces of the first arm portion and the second arm portion are respectively formed in the shape of a flat surface, and thus it is possible to easily manufacture the support arm portion.

In the piezoelectric vibration piece according to the aspect of the present invention, the support arm portion may include an extending arm portion extending from a base portion side in which a tip end side is connected to a base end side of the first arm portion, and a specially shaped portion may be formed on a base portion side of a side surface of the extending arm portion.

In the piezoelectric vibration piece having such a configuration, the first arm portion which is formed such that the width is narrowed towards the first direction is disposed on the tip end portion side of the support arm portion from the extending arm portion. Accordingly, the base end side of the support arm portion in which the specially shaped portion is easily generated, that is, the extending arm portion is formed such that the width is broader than that of the tip end side of the first arm portion, and thus it is possible to suppress the breakage of the support arm portion on the base end side due to stress concentration.

In the piezoelectric vibration piece according to the aspect of the present invention, the support arm portion may include a tip end arm portion extending in the first direction from the second arm portion in which the width is constant.

In the piezoelectric vibration piece having such a configuration, even when the width is narrowed along the first direction, the width of the tip end arm portion is constant, and thus the area of the tip end arm portion is broadened. In the present invention, a conductive adhesive agent which is applied to the tip end arm portion for mounting easily wet-spreads along a width direction of the support arm portion (the second direction), and thus it is possible to prevent the conductive adhesive agent from excessively wet-spreading to the first direction. Accordingly, the conductive adhesive agent is prevented from excessively wet-spreading and thus from reaching the first arm portion to which the conductive adhesive agent is not necessarily applied, and thus it is possible to reliably mount the tip end arm portion and the second arm portion in the package.

In addition, the width of the tip end arm portion is constant, and thus the conductive adhesive agent is homogeneously applied to the tip end arm portion along the first direction. Accordingly, a variation in the mass of the tip end arm portion along the first direction is suppressed, and thus it is possible to increase a mounting strength.

In the piezoelectric vibration piece according to the aspect of the present invention, a boundary portion between the first arm portion and the second arm portion may be positioned on the base portion side of the support arm portion from an intermediate position in the first direction.

In the piezoelectric vibration piece having such a configuration, the boundary portion is arranged on the base portion side of the support arm portion from the intermediate position in the first direction, and thus it is possible to increase a distance from the tip end portion of the support arm portion to the boundary portion. Accordingly, even when the conductive adhesive agent applied to the tip end portion of the support arm portion wet-spreads to the first direction, the conductive adhesive agent is prevented from reaching the boundary portion. Accordingly, the conductive adhesive agent is prevented from being attached to the boundary portion, and thus the vibration is prevented from being leaked through the conductive adhesive agent.

In the piezoelectric vibration piece according to the aspect of the present invention, one side surface of the first arm portion and the second arm portion may be formed in the shape of a flat surface which extends towards the first direction, the other side surface of the first arm portion may be formed in the shape of a flat surface to be gradually close to the one side surface of the first arm portion towards the tip end portion side, and the other side surface of the second arm portion may be formed in the shape of a flat surface to be gradually separated from the one side surface of the second arm portion towards the tip end portion side.

In the piezoelectric vibration piece having such a configuration, the one side surface of the first arm portion and the second arm portion is formed in the shape of a flat surface extending towards the first direction, and thus it is possible to easily manufacture the support arm portion.

In the piezoelectric vibration piece according to the aspect of the present invention, a change rate of a width dimension of the second arm portion along the first direction may be greater than a change rate of a width dimension of the first arm portion along the first direction.

In the piezoelectric vibration piece having such a configuration, the change rate along the width dimension of the second arm portion along the first direction is greater than the change rate of the width dimension of the first arm portion along the first direction. Accordingly, the change rate of broadening the width of the second arm portion increases, and thus it is possible to reliably suppress the vibration leakage.

According to another aspect of the present invention, there is provided an piezoelectric vibrator including a package including a base member, and a lid member joined to the base member in an overlapping manner in which a hermetically sealed cavity is formed between the base member and the lid member, and the piezoelectric vibration piece according to any one of the aspects of the present invention which is mounted on a mounting surface of the base member and is contained in the cavity.

In the piezoelectric vibrator having such a configuration, the first arm portion of the support arm portion is formed such that the width is gradually narrowed towards the tip end portion side, and thus it is possible to suppress the occurrence of the vibration leakage.

In addition, the second arm portion of the support arm portion is formed such that the width is gradually broadened towards the tip end portion side, and thus the area of the second arm portion on the tip end side is broadened compared to a case where the width is narrowed along the first direction. Accordingly, when the tip end side of the second arm portion is mounted in the package, it is possible to increase the mounting surface area, and thus it is possible to increase the mounting strength with respect to the package of the piezoelectric vibration piece.

In addition, in the base end side of the support arm portion in which an etching residue is easily generated, that is, in the base end side of the first arm portion, the width is formed to be broader than that in the tip end side of the first arm portion. Accordingly, it is possible to ensure the strength of the base end side of the first arm portion, and thus it is possible to suppress the breakage of the support arm portion on the base end side. In addition, when a step portion or a notch is formed in the support arm portion, the etching residue is easily generated, but the support arm portion is formed such that the width is gradually changed along the first direction. Accordingly, the support arm portion prevents the etching residue from being generated along the first direction.

According to the piezoelectric vibration piece and the piezoelectric vibrator of the present invention, it is possible to reduce the occurrence of the vibration leakage while suppressing the breakage of the support arm portion, and it is possible to increase the mounting strength.

DETAILED DESCRIPTION OF THE PREFERRED EMBODIMENT

First Embodiment

As a first embodiment of the present invention, a piezoelectric vibrator will be described.

Figure 1:
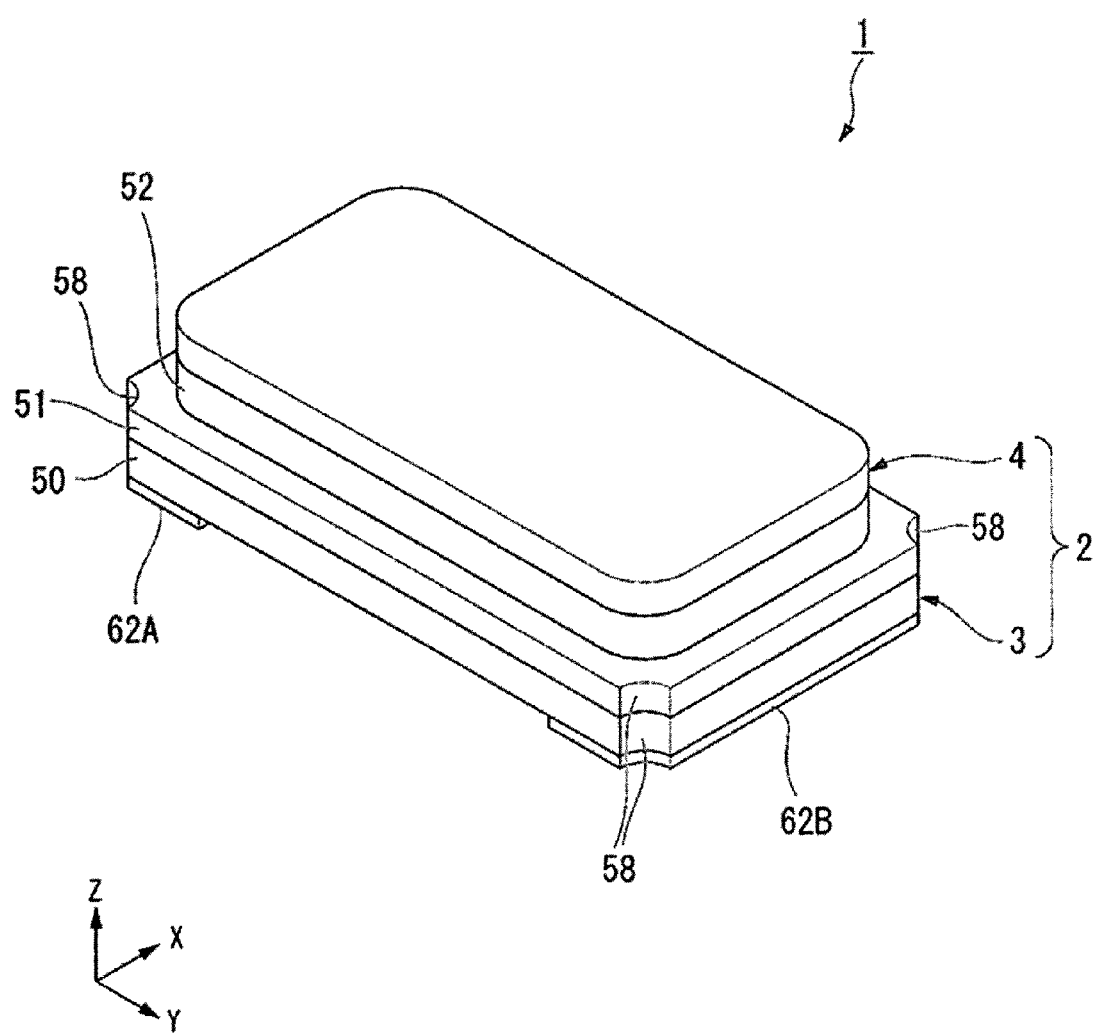
FIG. 1 is an external perspective view illustrating a piezoelectric vibrator according to a first embodiment of the present invention.
Figure 2:
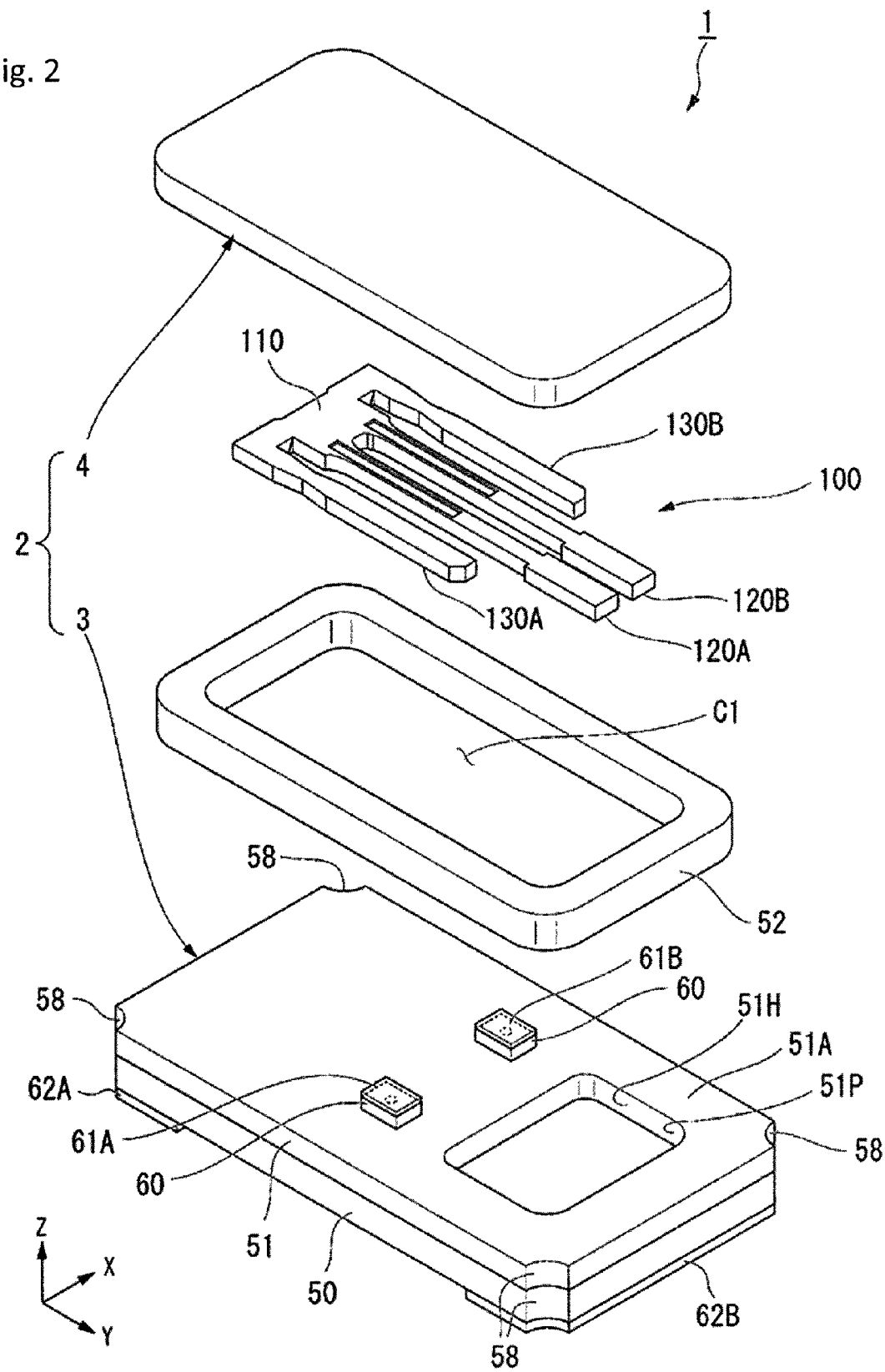
FIG. 2 is an exploded perspective view illustrating the piezoelectric vibrator according to the first embodiment of the present invention.
Figure 3:
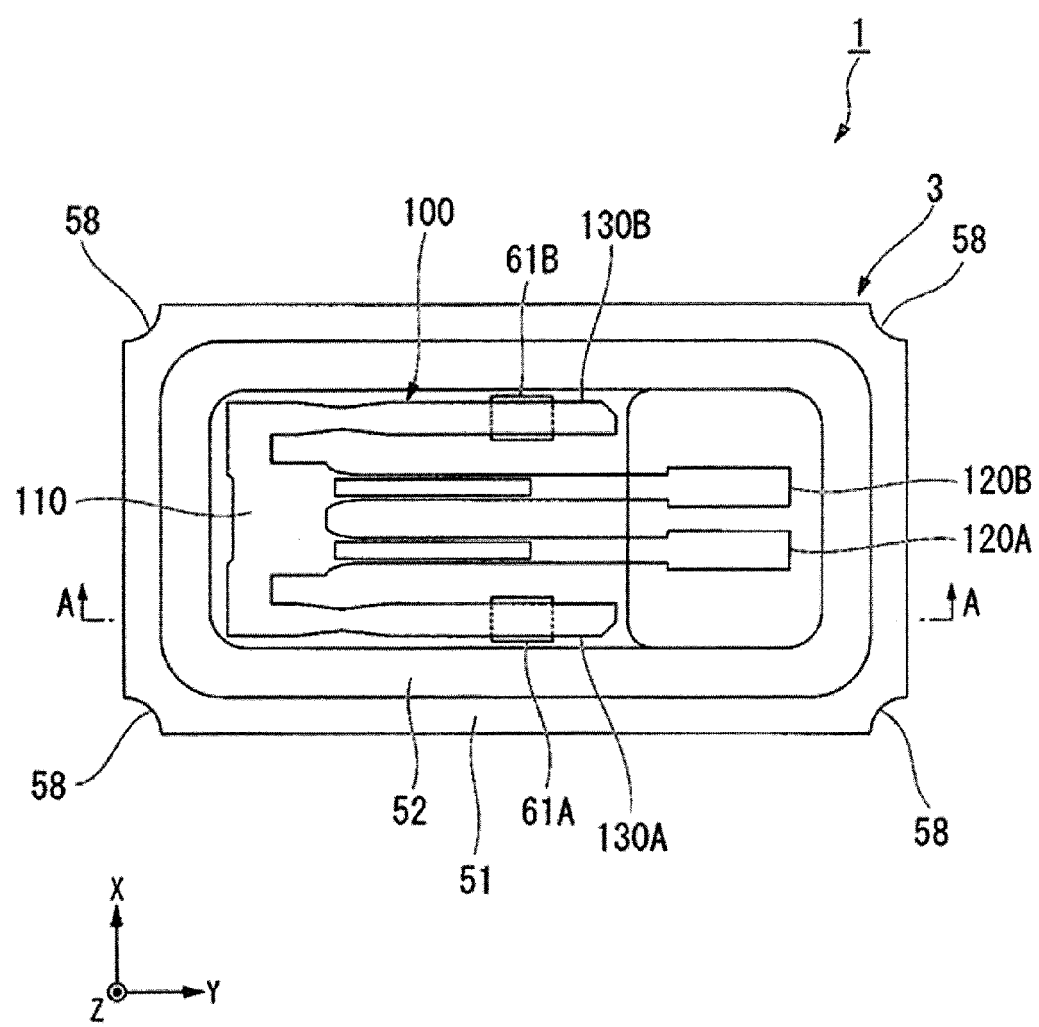
FIG. 3 is a plan view illustrating an internal structure of the piezoelectric vibrator according to the first embodiment of the present invention.
Figure 4:
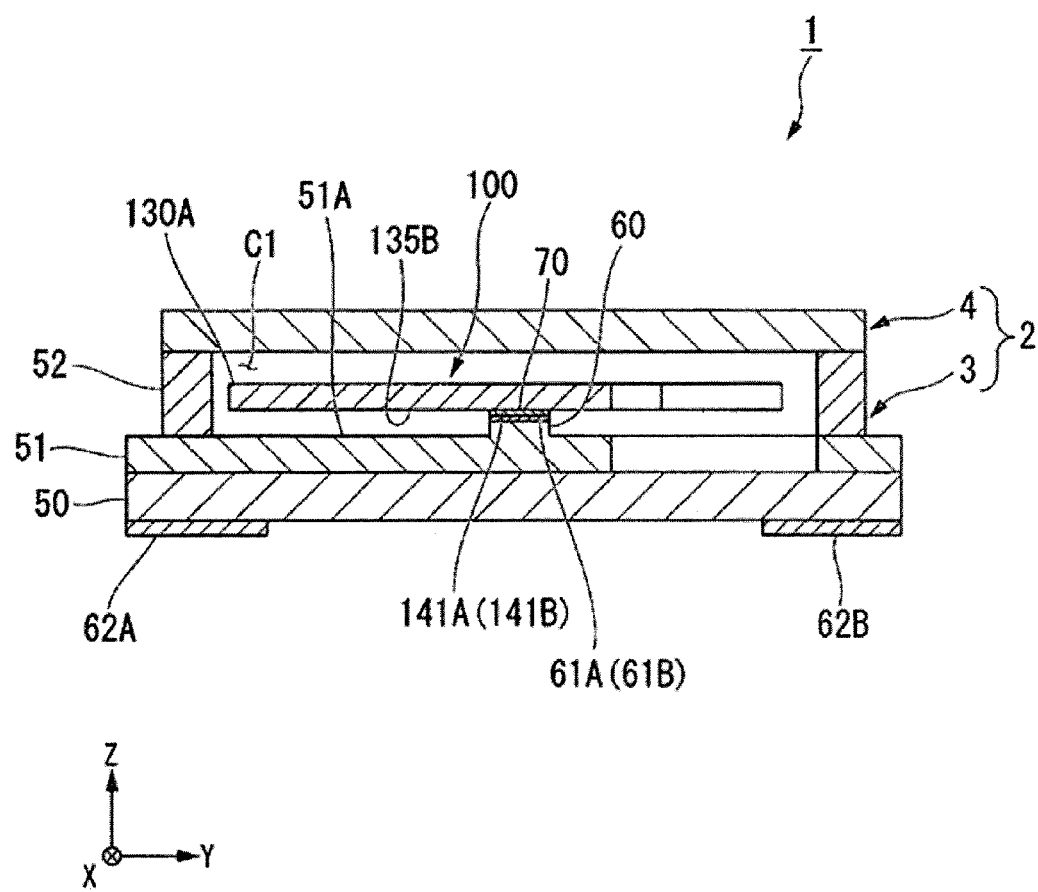
FIG. 4 is a sectional view taken along line A-A of FIG. 3.

FIG. 1 is an external perspective view illustrating a piezoelectric vibrator according to a first embodiment of the present invention. FIG. 2 is an exploded perspective view illustrating the piezoelectric vibrator according to the first embodiment of the present invention. FIG. 3 is a plan view illustrating an internal structure of the piezoelectric vibrator according to the first embodiment of the present invention. FIG. 4 is a sectional view taken along line A-A of FIG. 3.

In the following description of FIG. 1 to FIG. 9, an XYZ coordinate system is set, and a position relationship of each member will be described with reference to the XYZ coordinate system. At this time, a thickness direction of a piezoelectric vibrator 1 (refer to FIG. 1) is a Z axis direction, and a longitudinal direction of the piezoelectric vibrator 1 is a Y axis direction, and a direction which is short direction of the piezoelectric vibrator 1 and is orthogonal to both of the Y axis direction and the Z axis direction is an X axis direction.

Piezoelectric Vibrator

As illustrated in FIG. 1 to FIG. 4, the piezoelectric vibrator 1 is a so-called ceramic package type surface mounting vibrator of which the outline is approximately in the shape of a rectangular parallelepiped. The piezoelectric vibrator 1 includes a package 2 in which a hermetically sealed cavity C1 is formed, and a piezoelectric vibration piece 100 which is contained in the cavity C1.

The package 2 includes a package main body (a base member) 3, and a sealing plate (a lid member) 4 which is joined to the package main body 3 in an overlapping manner.

The package main body 3 includes a first base substrate 50 and a second base substrate 51 which are joined to each other in a state of overlapping with each other, and a seal ring 52 which is joined to an upper portion of the second base substrate 51.

The first base substrate 50 is a ceramic substrate which is formed approximately in the shape of a rectangle in a plan view. The second base substrate 51 is a ceramic substrate which is formed approximately in the shape of a rectangle which is the same outline as that of the first base substrate 50 in a plan view, and is integrally joined onto the first base substrate 50 in a state of overlapping therewith by sintering or the like.

In four corners of the first base substrate 50 and the second base substrate 51, a cut-out portion 58 which is in the shape of a ¼ arc in a plan view is formed over the entire first base substrate 50 and second base substrate 51 in a thickness direction. These first base substrate 50 and second base substrate 51, for example, are manufactured by joining two wafer-like ceramic substrates in an overlapping manner, by forming a plurality of through holes passing through both of the ceramic substrates in the shape of a matrix, and then by cutting both of the ceramic substrates into the shape of a lattice on the basis of each through hole. At this time, the through hole becomes the cut-out portion 58 described above by being divided by 4.

In addition, an upper surface of the second base substrate 51 is a mounting surface 51A on which the piezoelectric vibration piece 100 is mounted.

In addition, in the second base substrate 51, a through hole 51H is formed in a thickness direction (the Z axis direction). The through hole 51H is formed in the shape of a square having rounded four corners in a plan view.

In a state where the second base substrate 51 and the first base substrate 50 are joined to each other in an overlapping manner, the through hole 51H is a concave portion 51P which is concave in the thickness direction of the second base substrate 51 (the Z axis direction) from the mounting surface 51A of the second base substrate 51.

Furthermore, the first base substrate 50 and the second base substrate 51 are formed of ceramic, and as a specific ceramic material, for example, alumina High Temperature Co-Fired Ceramic (HTCC), glass ceramic Low Temperature Co-Fired Ceramic (LTCC), and the like are included.

The seal ring 52 is a conductive frame-like member which is slightly smaller than the outline of the first base substrate 50 and the second base substrate 51. The seal ring 52 is joined onto the mounting surface 51A of the second base substrate 51.

Specifically, the seal ring 52 is joined onto the mounting surface 51A by being baked with a brazing material of silver brazing, a soldering material, or the like, or is joined onto the mounting surface 51A by being welded to a metal junction layer which is formed on the mounting surface 51A (for example, by using a deposition method, a sputtering method, or the like in addition to electrolytic plating or electroless plating).

Furthermore, as the material of the seal ring 52, for example, a nickel-based alloy or the like is included, and specifically, the material may be selected from kovar, elinvar, invar, a 42-alloy, and the like. In particular, as the material of the seal ring 52, it is preferable to select a material of which the thermal expansion coefficient is close to that of the first base substrate 50 and second base substrate 51 which are formed of ceramic. For example, when alumina having a thermal expansion coefficient of $6.8 \times 10^{-6}/°$ C. is used as the first base substrate 50 and the second base substrate 51, it is preferable that kovar having a thermal expansion coefficient of $5.2 \times 10^{-6}/°$ C. or a 42-alloy having a thermal expansion coefficient of greater than or equal to $4.5 \times 10^{-6}/°C$ and less than or equal to $6.5 \times 10^{-6}/°C$ is used as the seal ring 52.

The sealing plate 4 is a conductive substrate superimposed on the upper portion of the seal ring 52. The sealing plate 4 is hermetically joined to the seal ring 52 by being baked with a brazing material of silver brazing, a soldering material, or the like. Then, a space defined by the sealing plate 4, the seal ring 52, and the mounting surface 51A of the second base substrate 51 functions as the hermetically sealed cavity C1.

Furthermore, as a welding method of the sealing plate 4, for example, seam welding which is performed by being in contact with a roller electrode, laser welding, ultrasonic welding, and the like are included. In addition, in order to more reliably weld the sealing plate 4 to the seal ring 52, it is preferable that a junction layer of nickel, gold, and the like which are familiar with each other is formed on at least a lower surface of the sealing plate 4 and an upper surface of the seal ring 52, respectively.

Convex portions 60 and 60 are disposed on the mounting surface 51A of the second base substrate 51. The convex portion 60 is formed to protrude to a side on which the piezoelectric vibration piece 100 is mounted, the shape of the convex portion 60 in a plan view is not particularly limited, and the convex portion 60 may be in the shape of a rectangle or in the other shapes (in the drawing, in the shape of a rectangle).

An upper surface of the convex portion 60 is in parallel with the mounting surface 51A. Two convex portions 60 are disposed on the mounting surface 51A on a −Y axis direction side of the concave portion 51P in symmetric positions by interposing the center of the width direction of the mounting surface 51A (the X axis direction). Electrode pads 61A and 61B which are connection electrodes with respect to the piezoelectric vibration piece 100 are formed on the upper surface of the convex portions 60 and 60, respectively.

A pair of external electrodes 62A and 62B is formed on the lower surface of the first base substrate 50 at intervals in the longitudinal direction of the piezoelectric vibrator 1 (the Y axis direction).

These electrode pads 61A and 61B and external electrodes 62A and 62B, for example, are a single layer film of single metal which is formed by using a deposition method, a sputtering method, or the like, or a laminated film in which different metals are laminated.

The electrode pad 61A and the external electrode 62A are electrically connected to each other through first wiring (not illustrated). In addition, the electrode pad 61B and the external electrode 62B are electrically connected to each other through second wiring (not illustrated).

Furthermore, the first wiring, for example, includes a first through electrode conducting the external electrode 62A by passing through the first base substrate 50 in the thickness direction (the Z axis direction), a second through electrode conducting the electrode pad 61A by passing through the second base substrate 51 in the thickness direction (the Z axis direction), and a connection wiring connecting the first through electrode and the second through electrode which are disposed between the first base substrate 50 and the second base substrate 51. The second wiring which connects the electrode pad 61B and the external electrode 62B has the same configuration as that of the first wiring. The configuration of the first wiring and the second wiring is able to be suitably selected.

Piezoelectric Vibration Piece

Figure 5:
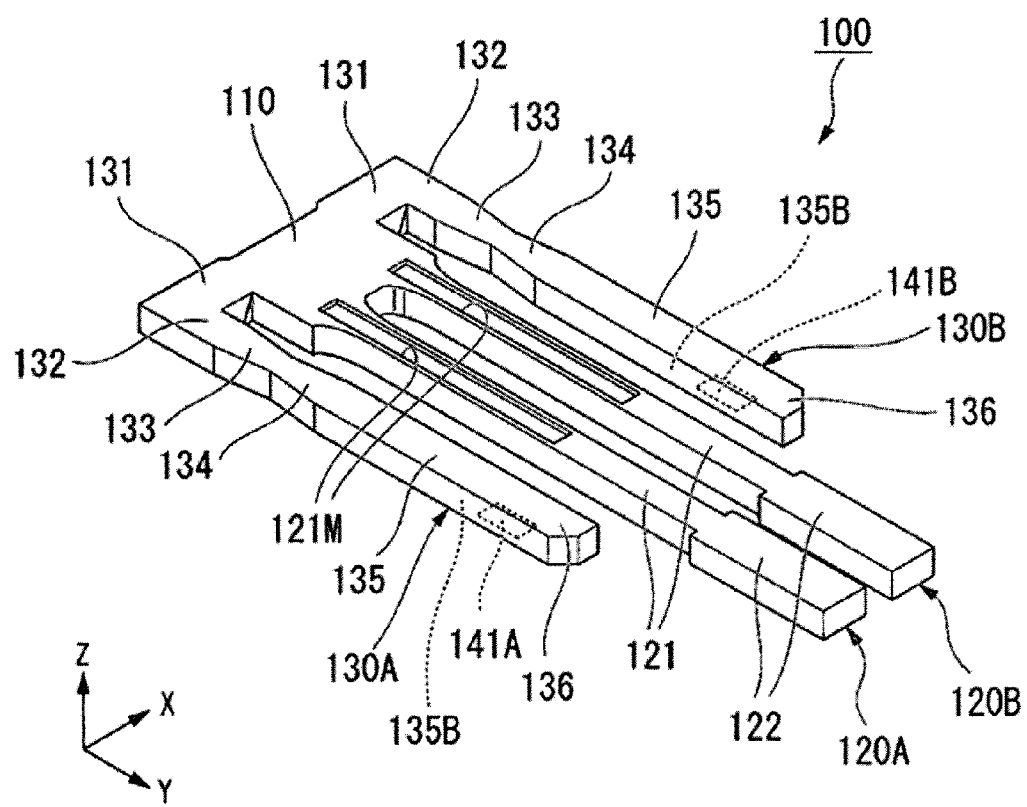
FIG. 5 is an external perspective view illustrating a piezoelectric vibration piece configuring the piezoelectric vibrator according to the first embodiment of the present invention.
Figure 6A:
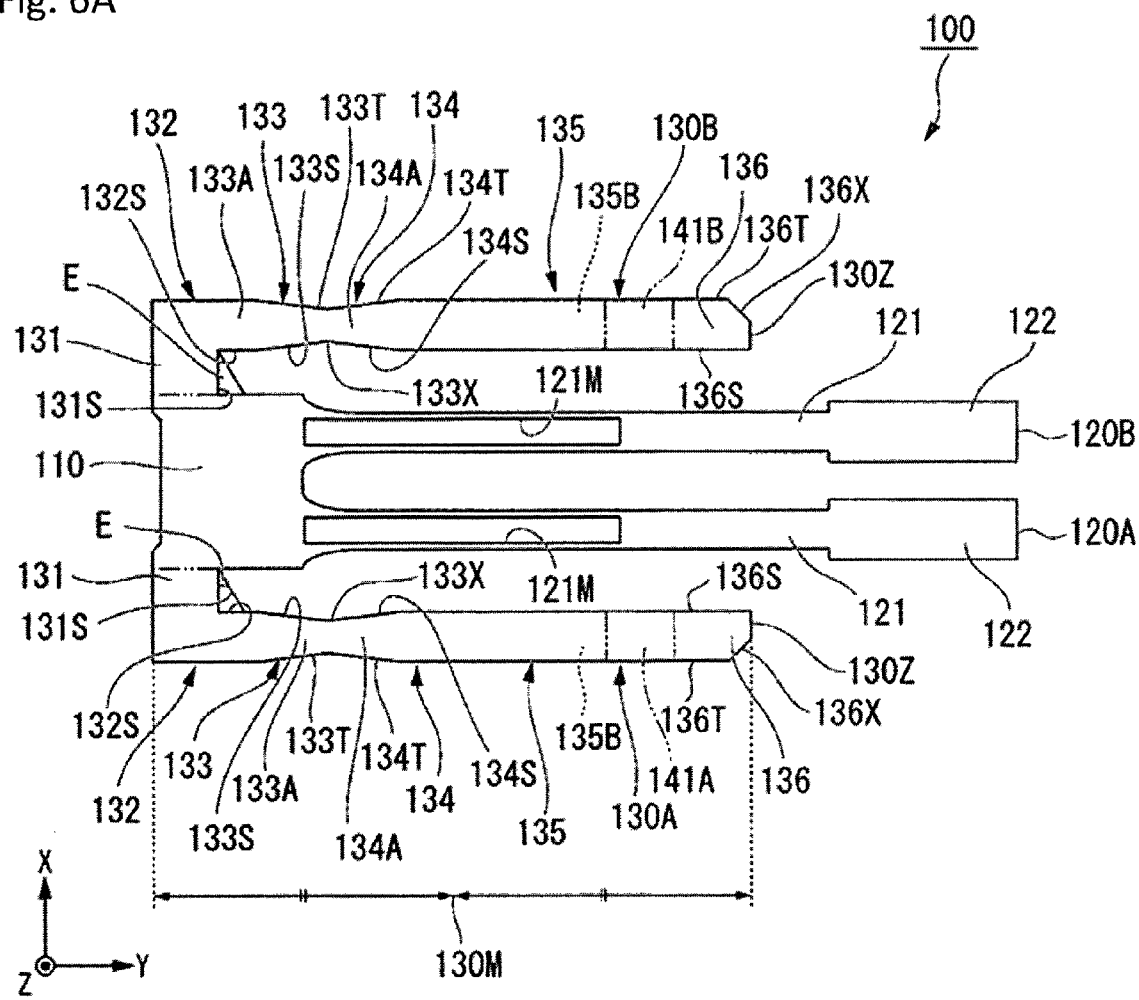
FIG. 6A is a plan view illustrating the piezoelectric vibration piece configuring the piezoelectric vibrator according to the first embodiment of the present invention.

FIG. 5 is an external perspective view illustrating the piezoelectric vibration piece 100. FIG. 6A is a plan view illustrating the piezoelectric vibration piece 100, and FIG. 6B is a side view thereof.

Figure 6B:
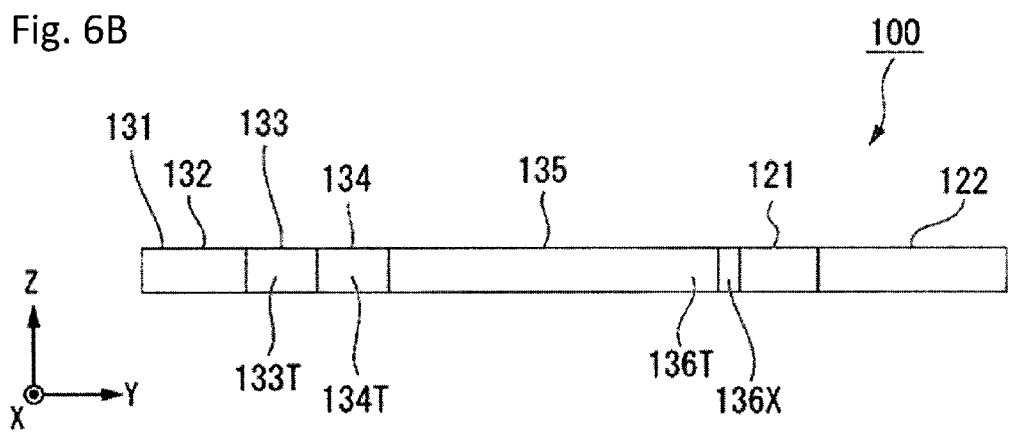
FIG. 6B is a side view thereof.

As illustrated in FIG. 5 and FIGS. 6A and 6B, the piezoelectric vibration piece 100 is formed in the shape of a flat plate. The piezoelectric vibration piece 100 includes a base portion 110, a pair of vibration arm portions 120A and 120B which is connected to the base portion 110 and is arranged in parallel in the width direction (the X axis direction), and a pair of support arm portions 130A and 130B which is connected to both sides of the vibration arm portions 120A and 120B in the width direction (the X axis direction) in the base portion 110.

The piezoelectric vibration piece 100 is a side arm type vibration piece which is formed of a piezoelectric material such as crystal, lithium tantalite, or lithium niobate, and is able to vibrate when a predetermined voltage is applied.

The thickness of the piezoelectric vibration piece 100 in a direction perpendicular to the surface of the piezoelectric vibration piece 100 (the length in the Z axis direction), for example, is able to be 30 μm.

In this embodiment, the base portion 110, the pair of vibration arm portions 120A and 120B, and the pair of support arm portions 130A and 130B are integrally formed, and the adjacent portions are connected without a boundary surface. In FIGS. 6A and 6B, in order to illustrate a range of each portion, a base end or a tip end of each portion is illustrated by a dashed-two dotted line.

The base portion 110 connects the vibration arm portions 120A and 120B and the support arm portions 130A and 130B. In a plan view (In an XY surface view), the base portion 110 is formed in the shape of a rectangle. The support arm portions 130A and 130B are respectively connected to an end portion of the vibration arm portions 120A and 120B on both sides of the width direction (a ±X side) in the base portion 110. The vibration arm portions 120A and 120B are respectively connected to the support arm portions 130A and 130B on one side of a length direction (a +Y side) in the base portion 110.

The vibration arm portions 120A and 120B extend towards the length direction of the support arm portions 130A and 130B (a +Y axis direction, and a first direction) from the base portion 110. The vibration arm portions 120A and 120B are disposed in parallel in a direction (a second direction, and the X axis direction) which is perpendicular to the longitudinal direction (the Y axis direction) and is in parallel with the surface of the piezoelectric vibration piece 100.

The vibration arm portions 120A and 120B respectively include a strip portion 121 which linearly extends with a constant width (the length in the X axis direction), and a hammer portion 122 which is disposed on an tip end of the strip portion 121, and of which the width (the length in the X axis direction) is broader than that of the strip portion 121.

A groove portion 121M which extends in the shape of a strip in the length direction of the support arm portions 130A and 130B (the +Y axis direction) is formed in the strip portion 121.

Furthermore, in this embodiment, one groove portion 121M is formed in each of the vibration arm portions 120A and 120B, and a plurality of groove portions may be formed separately in the length direction of the support arm portions 130A and 130B (the +Y axis direction). For example, a groove portion of which the length is long in the +Y axis direction may be formed on the tip end side of the vibration arm portions 120A and 120B, and a groove portion of which the length is short in the +Y axis direction may be formed on the base end side of the vibration arm portions 120A and 120B.

The hammer portion 122 is formed to extend to the length direction of the vibration arm portions 120A and 120B (the +Y axis direction) from a tip end portion of the strip portion 121. The width of the hammer portion 122 (the length in the X axis direction) is formed to be greater than the width of the vibration arm portions 120A and 120B (the length in the X axis direction). The hammer portion 122 is set as a free end vibrating in the width direction (the X axis direction) by setting the base portion 110 as a fixed end.

In addition, an exciting electrode (not illustrated) which vibrates the pair of vibration arm portions 120A and 120B is formed on an outer surface of the pair of vibration arm portions 120A and 120B.

The support arm portions 130A and 130B extend towards the length direction of the vibration arm portions 120A and 120B (the +Y axis direction) from the base portion 110. The support arm portions 130A and 130B are disposed in parallel in a direction which is perpendicular to the longitudinal direction (the Y axis direction) and is parallel with the surface of the piezoelectric vibration piece 100 (the X axis direction).

The support arm portions 130A and 130B respectively include a base end arm portion 131 extending in the width direction of the vibration arm portions 120A and 120B (the X axis direction) from the base portion 110, and an extending arm portion 132 extending in the length direction of the vibration arm portions 120A and 120B (the +Y axis direction) from the base end arm portion 131. Further, the support arm portions 130A and 130B include a first arm portion 133 extending in the length direction of the vibration arm portions 120A and 120B (the +Y axis direction) from the extending arm portion 132, and a second arm portion 134 extending in the length direction of the vibration arm portions 120A and 120B (the +Y axis direction) from the first arm portion 133. Further, the support arm portions 130A and 130B include a tip end arm portion 135 extending in the length direction of the vibration arm portions 120A and 120B (the +Y axis direction) from the second arm portion 134, and an inclined arm portion 136 disposed in the tip end arm portion 135. The base end arm portion 131, the extending arm portion 132, the first arm portion 133, the second arm portion 134, the tip end arm portion 135, and the inclined arm portion 136 are integrally formed.

The base end arm portion 131 extends in the width direction of the vibration arm portions 120A and 120B (the X axis direction) from the −Y axis side of the base portion 110. The length of the base end arm portion 131 in the Y axis direction is shorter than the length of the base portion 110 in the Y axis direction.

The extending arm portion 132 has a constant width (the length in the X axis direction) over the length direction (the +Y axis direction). In a side surface of the extending arm portion 132 on the base portion 110 side, in this embodiment, in a corner portion formed by a side surface 132S of the extending arm portion 132 which is directed towards the vibration arm portions 120A and 120B side and a surface 131S of the base end arm portion 131 which is directed towards the length direction (the +Y axis direction), an etching residue E (a specially shaped portion) is formed. Furthermore, the etching residue E is not formed in the first arm portion 133.

The width of the first arm portion 133 on the base portion 110 side (the −Y axis side) (the length in the X axis direction) is identical to the width of the extending arm portion 132 on the tip end side, and the first arm portion 133 is formed such that the width is gradually narrowed towards the tip end portion 130Z side of the support arm portions 130A and 130B, that is, the +Y axis direction.

In this embodiment, both side surfaces 133S and 133T which are orthogonal to a principal surface (an XY surface) 133A of the first arm portion 133 are formed in the shape of a flat surface. The both side surfaces 133S and 133T of the first arm portion 133 are formed to be gradually close to each other towards the length direction of the support arm portions 130A and 130B (the +Y axis direction).

The width of the second arm portion 134 on the base portion 110 side (the −Y axis side) (the length in the X axis direction) is identical to the width of the first arm portion 133 on the tip end side. The second arm portion 134 is formed such that the width is gradually broadened towards the tip end portion 130Z side of the support arm portions 130A and 130B, that is, the +Y axis direction.

Both side surfaces 134S and 134T which are orthogonal to a principal surface (an XY surface) 134A of the second arm portion 134 are formed to be connected to the both side surfaces 133S and 133T of the first arm portion 133, respectively. In this embodiment, the both side surfaces 134S and 134T of the second arm portion 134 are formed in the shape of a flat surface. The both side surfaces 134S and 134T of the second arm portion 134 are formed to be gradually separated from each other towards the length direction of the support arm portions 130A and 130B (the +Y axis direction).

In this embodiment, the first arm portion 133 and the second arm portion 134 are symmetrically formed by interposing a boundary portion 133X between the first arm portion 133 and the second arm portion 134. Accordingly, a change rate of a width dimension along the length direction of the first arm portion 133 (the +Y axis direction) is identical to a change rate of a width dimension along the length direction of the second arm portion 134 (the +Y axis direction).

In addition, in the length direction of the support arm portions 130A and 130B (the +Y axis direction), the boundary portion 133X between the first arm portion 133 and the second arm portion 134 is positioned on the base portion 110 side from an intermediate position 130M of the support arm portions 130A and 130B in the first direction.

The tip end arm portion 135 is formed to be connected to the second arm portion 134, and extends along the length direction (the +Y axis direction). The width of the tip end arm portion 135 (the length in the X axis direction) is identical to the width of the second arm portion 134 on the tip end side, and is constant over the length direction (the +Y axis direction).

Mounting portions 141A and 141B are disposed on a facing surface (an XY surface) 135B of the tip end arm portion 135. A position in which the mounting portions 141A and 141B are disposed is a position of a vibration node when the support arm portions 130A and 130B vibrate.

The inclined arm portion 136 is disposed on a tip end of the tip end arm portion 135. An inclined surface 136X formed to be gradually close to the vibration arm portions 120A and 120B towards the length direction of the support arm portions 130A and 130B (the +Y axis direction) is disposed in a side surface 136T which is farther from the vibration arm portions 120A and 120B among side surfaces 136S and 136T of the inclined arm portion 136.

Then, as illustrated in FIG. 4, the piezoelectric vibration piece 100 is mounted such that a mounting electrode (not illustrated) formed on the mounting portions 141A and 141B is in contact with the electrode pads 61A and 61B through a conductive adhesive agent 70.

Accordingly, the piezoelectric vibration piece 100 is supported such that the principal surface is in parallel with the mounting surface 51A of the second base substrate 51, and is electrically connected to each of the pair of electrode pads 61A and 61B.

When the piezoelectric vibrator 1 having such a configuration is operated, a predetermined driving voltage is applied to the external electrode 62A and 62B. Accordingly, a current is able to flow through the exciting electrode of the piezoelectric vibration piece 100, and the one vibration arm portion 120A and the other vibration arm portion 120B are able to vibrate at a predetermined frequency along the surface of the piezoelectric vibration piece 100. Then, it is possible to use the piezoelectric vibrator 1 as a time source, a timing source of a control signal, a reference signal source, or the like by using this vibration.

Furthermore, as the conductive junction material for joining the mounting electrode to the electrode pads 61A and 61B, a metal bump is able to be used instead of the conductive adhesive agent. The conductive adhesive agent and the metal bump are common in that the conductive adhesive agent and the metal bump are a conductive junction material which is in the shape of a paste having fluidity in an initial junction step, and has properties of expressing a junction strength by being solidified in a later junction step.

In the piezoelectric vibrator 1 having such a configuration, the first arm portion 133 of the support arm portions 130A and 130B is formed such that the width is gradually narrowed towards the tip end portion 130Z side, and thus it is possible to suppress an occurrence of a vibration leakage.

In addition, the second arm portion 134 of the support arm portions 130A and 130B is formed such that the width is gradually broadened towards the tip end portion 130Z side, and thus it is possible to increase the area of the second arm portion 134 on the tip end side. Accordingly, when the tip end side of the second arm portion 134, that is, the tip end arm portion 135 is mounted in the package 2, it is possible to increase a mounting surface area (the area of the mounting portions 141A and 141B), and thus it is possible to increase the mounting strength of the piezoelectric vibration piece 100 with respect to the package 2.

In addition, in the base end side of the support arm portions 130A and 130B in which the etching residue E is easily generated, that is, in the extending arm portion 132, the width is formed to be broader than that of the tip end side of the first arm portion 133. Accordingly, it is possible to ensure the rigidity of the support arm portions 130A and 130B on the base end side, and thus it is possible to suppress a breakage of the support arm portions 130A and 130B on the base end side due to stress concentration.

In addition, when a step portion or a notch is formed in the support arm portions 130A and 130B, the etching residue E is easily generated, but the support arm portions 130A and 130B are formed such that the width is gradually changed along the longitudinal direction (the Y axis direction). Accordingly, the support arm portions 130A and 130B prevent the etching residue E from being generated along the longitudinal direction (the Y axis direction).

In addition, each of the both side surfaces 133S and 133T, and 134S and 134T of the first arm portion 133 and the second arm portion 134 is formed in the shape of a flat surface, and thus it is possible to easily manufacture the support arm portions 130A and 130B.

In addition, in this embodiment, for example, even when the width is narrowed along the longitudinal direction (the Y axis direction), the width of the tip end arm portion 135 is constant over the longitudinal direction (the Y axis direction), and thus the area of the tip end arm portion 135 is broadened. Accordingly, the conductive adhesive agent 70 applied to the mounting portions 141A and 141B for mounting easily wet-spreads along the width direction of the support arm portions 130A and 130B (the X axis direction), and thus it is possible to prevent the conductive adhesive agent 70 from excessively wet-spreading to the longitudinal direction of the piezoelectric vibrator 1 (the Y axis direction). Accordingly, the conductive adhesive agent 70 is prevented from excessively wet-spreading and thus from reaching the first arm portion 133 to which the conductive adhesive agent 70 is not necessarily applied, and thus it is possible to reliably mount the tip end arm portion 135 in the package 2.

In addition, the width of the tip end arm portion 135 is constant, and thus the conductive adhesive agent 70 is homogeneously applied to the tip end arm portion 135 along the longitudinal direction of the piezoelectric vibrator 1 (the Y axis direction). Accordingly, a variation in the mass of the tip end arm portion 135 along the longitudinal direction of the piezoelectric vibrator 1 (the Y axis direction) is suppressed, and thus it is possible to increase the mounting strength.

In addition, the boundary portion 133X is arranged on the base portion 110 side from the intermediate position 130M of the support arm portions 130A and 130B in the longitudinal direction of the piezoelectric vibrator 1 (the Y axis direction), and thus it is possible to increase a distance from the tip end portion 130Z of the support arm portions 130A and 130B to the boundary portion 133X. Accordingly, even when the conductive adhesive agent 70 applied to the mounting portions 141A and 141B wet-spreads to the longitudinal direction of the piezoelectric vibrator 1 (the Y axis direction), the conductive adhesive agent 70 does not reach the boundary portion 133X. Accordingly, the conductive adhesive agent 70 is attached to the boundary portion 133X, and the vibration is prevented from being leaked through the conductive adhesive agent 70.

Modification Example 1 of First Embodiment

Next, Modification Example 1 of the first embodiment described above will be described with mainly reference to FIGS. 7A and 7B.

Furthermore, in the following modification example and embodiment, the same reference numerals are applied to the same configurations as those of the embodiment described above in the drawings, and the description thereof will be omitted.

Figure 7A:
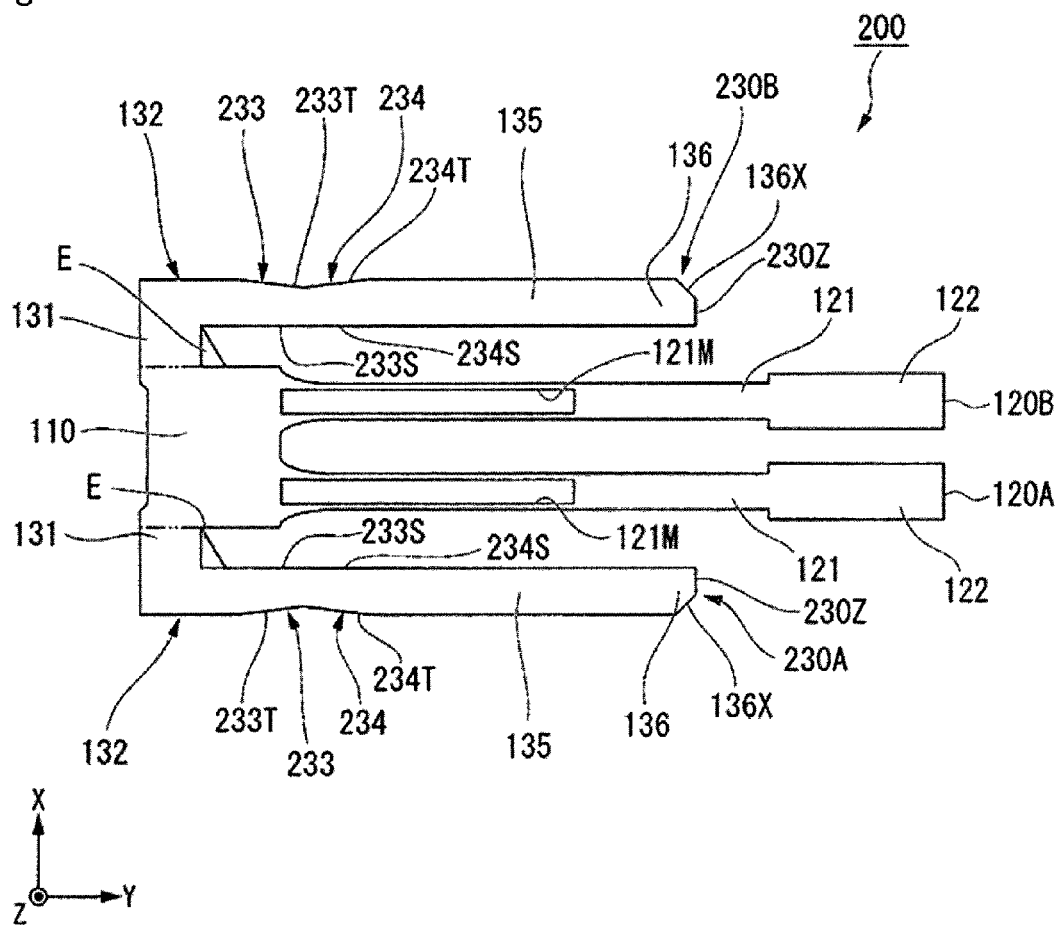
FIG. 7A is a plan view illustrating a piezoelectric vibration piece configuring a piezoelectric vibrator according to Modification Example 1 of the first embodiment of the present invention.
Figure 7B:
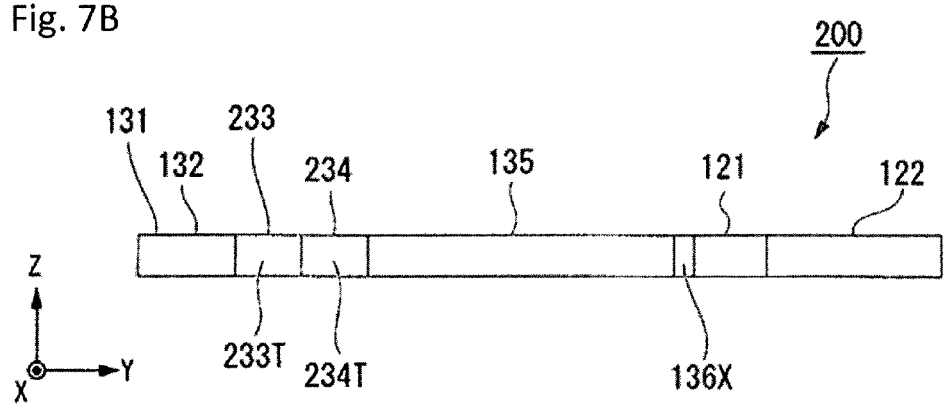
FIG. 7B is a side view thereof.

FIG. 7A is a plan view illustrating a piezoelectric vibration piece configuring a piezoelectric vibrator according to Modification Example 1 of the first embodiment of the present invention, and FIG. 7B is a side view thereof.

As illustrated in FIGS. 7A and 7B, an inside surface 233S which is closer to the vibration arm portions 120A and 120B among both side surfaces 233S and 233T of a first arm portion 233 configuring a piezoelectric vibration piece 200 is arranged on a YZ flat surface orthogonal to the principal surface (an XY surface) along the length direction of the support arm portions 230A and 230B (the +Y axis direction).

In addition, as with the first embodiment, an outside surface 233T which is farther from the vibration arm portions 120A and 120B among the both side surfaces 233S and 233T of the first arm portion 233 is formed to be close to the inside surface 233S gradually facing the outside surface 233T towards the length direction of the support arm portions 230A and 230B (the +Y axis direction). Thus, the first arm portion 233 is formed such that the width is gradually narrowed towards a tip end portion 230Z side of the support arm portions 230A and 230B, that is, the +Y axis direction.

In addition, an inside surface 234S which is closer to the vibration arm portions 120A and 120B among both side surfaces 234S and 234T of a second arm portion 234 configuring the piezoelectric vibration piece 200 is arranged on the same surface of the inside surface 233S of the first arm portion 233. That is, the inside surface 234S is arranged on the YZ flat surface orthogonal to the principal surface (an XY surface) along the length direction of the support arm portions 230A and 230B (the +Y axis direction).

In addition, as with the first embodiment, an outside surface 234T which is farther from the vibration arm portions 120A and 120B among the both side surfaces 234S and 234T of the second arm portion 234 is formed to be connected to the outside surface 233T of the first arm portion 233. The outside surface 234T of the second arm portion 234 is formed to be separated from the inside surface 234S gradually facing the outside surface 234T towards the length direction of the support arm portions 230A and 230B (the +Y axis direction). Thus, the second arm portion 234 is formed such that the width is gradually broadened towards the tip end portion 230Z side of the support arm portions 230A and 230B, that is, the +Y axis direction.

In the piezoelectric vibration piece 200 having such a configuration, the inside surface 233S of the first arm portion 233 and the inside surface 234S of the second arm portion 234 are formed in the shape of a flat surface extending towards the length direction of the support arm portions 230A and 230B (the +Y axis direction), and thus it is possible to easily manufacture the support arm portions 230A and 230B.

Furthermore, the outside surface of the first arm portion and the outside surface of the second arm portion may be formed in the shape of a flat surface extending towards the length direction of the support arm portion (the +Y axis direction), the inside surface of the first arm portion may be formed to be close to the outside surface gradually facing the inside surface towards the length direction of the support arm portion (the +Y axis direction), and the inside surface of the second arm portion may be configured to be separated from the outside surface gradually facing the inside surface towards the length direction of the support arm portion (the +Y axis direction).

Modification Example 2 of First Embodiment

Next, Modification Example 2 of the first embodiment described above will be described with mainly reference to FIGS. 8A and 8B.

Figure 8A:
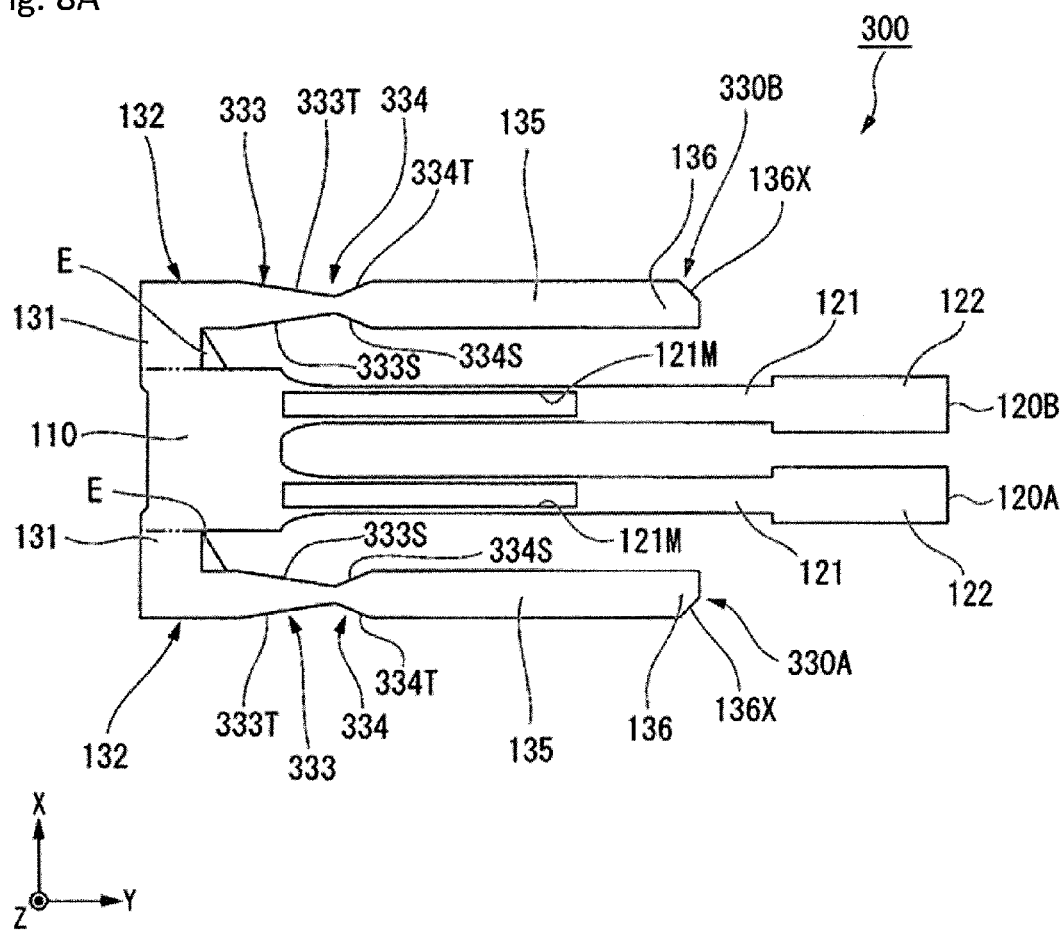
FIG. 8A is a plan view illustrating a piezoelectric vibration piece configuring a piezoelectric vibrator according to Modification Example 2 of the first embodiment of the present invention.
Figure 8B:
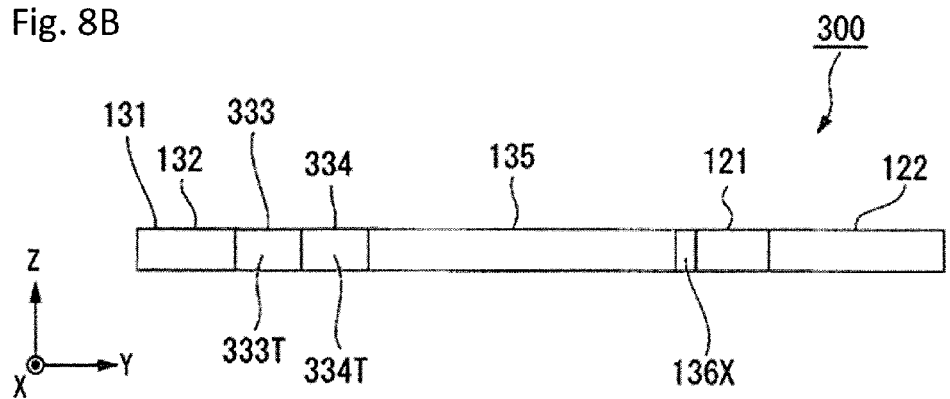
FIG. 8B is a side view thereof.

FIG. 8A is a plan view illustrating a piezoelectric vibration piece configuring a piezoelectric vibrator according to Modification Example 2 of the first embodiment of the present invention, and FIG. 8B is a side view thereof.

As illustrated in FIGS. 8A and 8B, in a piezoelectric vibration piece 300, both side surfaces 333S and 333T of a first arm portion 333 are formed to be gradually close to each other towards the length direction of support arm portions 330A and 330B (the +Y axis direction). Both side surfaces 334S and 334T of a second arm portion 334 are formed to be gradually separated from each other towards the length direction of the support arm portions 330A and 330B (the +Y axis direction).

A change rate of a width dimension along the length direction of the second arm portion 334 (the +Y axis direction) is greater than a change rate of a width dimension along the length direction of the first arm portion 333 (the +Y axis direction). In other words, the width dimension of the first arm portion 333 is gradually narrowed towards the length direction (the +Y axis direction), whereas the width dimension of the second arm portion 334 is rapidly broadened towards the length direction (the +Y axis direction).

In the piezoelectric vibration piece 300 having such a configuration, the change rate of the width dimension in which the width of the second arm portion 334 is broadened increases, and thus it is possible to reliably suppress the vibration leakage.

Second Embodiment

Next, a piezoelectric vibration piece according to a second embodiment will be described with mainly reference to FIG. 9A.

Figure 9A:
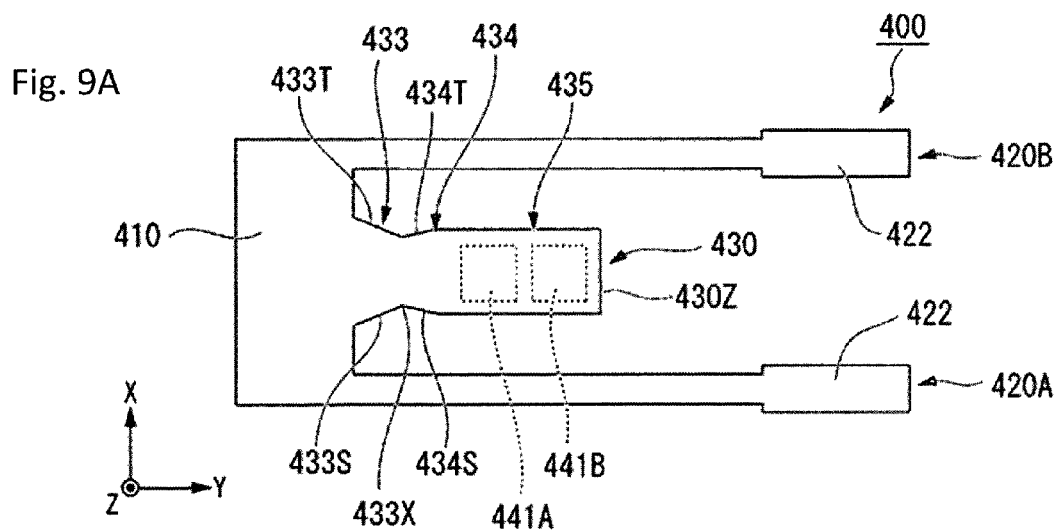
FIG. 9A is a plan view illustrating a piezoelectric vibration piece according to a second embodiment of the present invention.

FIG. 9A is a plan view illustrating a piezoelectric vibration piece according to a second embodiment of the present invention.

As illustrated in FIG. 9A, a piezoelectric vibration piece 400 is a center arm type vibration piece. The piezoelectric vibration piece 400 includes a base portion 410, a pair of vibration arm portions 420A and 420B, and a support arm portion 430.

The vibration arm portions 420A and 420B respectively extend towards the same direction (the +Y axis direction) from the base portion 410. The vibration arm portions 420A and 420B are disposed in parallel in a direction which is perpendicular to the longitudinal direction (the Y axis direction) and is in parallel with the surface of the piezoelectric vibration piece 400 (the X axis direction). An exciting electrode (not illustrated) which vibrates the pair of vibration arm portions 420A and 420B is formed on an outer surface of the vibration arm portions 420A and 420B.

A hammer portion 422 is disposed in a tip end portion of each of the vibration arm portions 420A and 420B. The hammer portion 422 is formed to extend in the length direction of the vibration arm portions 420A and 420B (the +Y axis direction) from the tip end portion of each of the vibration arm portions 420A and 420B. The width of the hammer portion 422 (the length in the X axis direction) is formed to be greater than the width of the vibration arm portions 420A and 420B (the length in the X axis direction). The hammer portion 422 is set as a free end vibrating in the width direction (the X axis direction) by setting the base portion 410 as a fixed end.

The support arm portion 430 extends towards the length direction of the vibration arm portions 420A and 420B (the +Y axis direction) from a portion in which the vibration arm portions 420A and 420B extend in the base portion 410. The support arm portion 430 includes a first arm portion 433 extending from the base portion 410, a second arm portion 434 formed to be connected to the first arm portion 433, and a tip end arm portion 435 formed to be connected to the second arm portion 434.

The first arm portion 433 is formed such that the width is gradually narrowed towards a tip end portion 430Z side of the support arm portion 430, that is, the +Y axis direction.

Both side surfaces 433S and 433T of the first arm portion 433 are formed in the shape of a flat surface. The both side surfaces 433S and 433T of the first arm portion 433 are formed to be gradually close to each other towards the length direction of the support arm portion 430 (the +Y axis direction).

The width of the second arm portion 434 on the base portion 410 side (the −Y axis side) (the length in the X axis direction) is identical to the width of the first arm portion 433 on the tip end side, and the second arm portion 434 is formed such that the width is gradually broadened towards the tip end portion 430Z side of the support arm portion 430, that is, the +Y axis direction.

Both side surfaces 434S and 434T of the second arm portion 434 are formed to be connected the both side surfaces 433S and 433T of the first arm portion 433, respectively. The both side surfaces 434S and 434T of the second arm portion 434 are formed in the shape of a flat surface. The both side surfaces 434S and 434T of the second arm portion 434 are formed to be gradually separated from each other towards the length direction of the support arm portion 430 (the +Y axis direction).

In this embodiment, the first arm portion 433 and the second arm portion 434 are symmetrically formed by interposing a boundary portion 433X between the first arm portion 433 and the second arm portion 434. Accordingly, a change rate of a width dimension along the length direction of the first arm portion 433 (the +Y axis direction) is identical to a change rate of a width dimension along the length direction of the second arm portion 434 (the +Y axis direction).

The tip end arm portion 435 is formed to be connected to the second arm portion 434, and extends along the length direction (the +Y axis direction). The width of the tip end arm portion 435 is identical to the width of the second arm portion 434 on the tip end side, and the width (the length in the X axis direction) is constant.

Mounting portions 441A and 441B are disposed separately in a principal surface (an XY surface) of the tip end arm portion 435 in the length direction of the support arm portion 430 (the +Y axis direction). A position in which the mounting portions 141A and 141B are disposed is a position of a vibration node when the support arm portion 430 vibrates.

Then, in the piezoelectric vibration piece 400, a mounting electrode (not illustrated) formed in the mounting portions 441A and 441B is mounted to be in contact with an electrode pad (not illustrated) through the conductive adhesive agent (not illustrated).

Accordingly, the piezoelectric vibration piece 400 is supported such that the principal surface is in parallel with the mounting surface 51A (refer to FIG. 2) of the second base substrate 51 (refer to FIG. 2), and is electrically connected to each of the pair of electrode pads.

When the piezoelectric vibrator 1 having such a configuration is operated, a predetermined driving voltage is applied to the external electrode 62A and 62B. Accordingly, a current is able to flow through an exciting electrode of the piezoelectric vibration piece 400, and one vibration arm portion 420A and the other vibration arm portion 420B are able to vibrate at a predetermined frequency along the surface of the piezoelectric vibration piece 400.

Modification Example 1 of Second Embodiment

Next, Modification Example 1 of the second embodiment described above will be described with mainly reference to FIG. 9B.

Figure 9B:
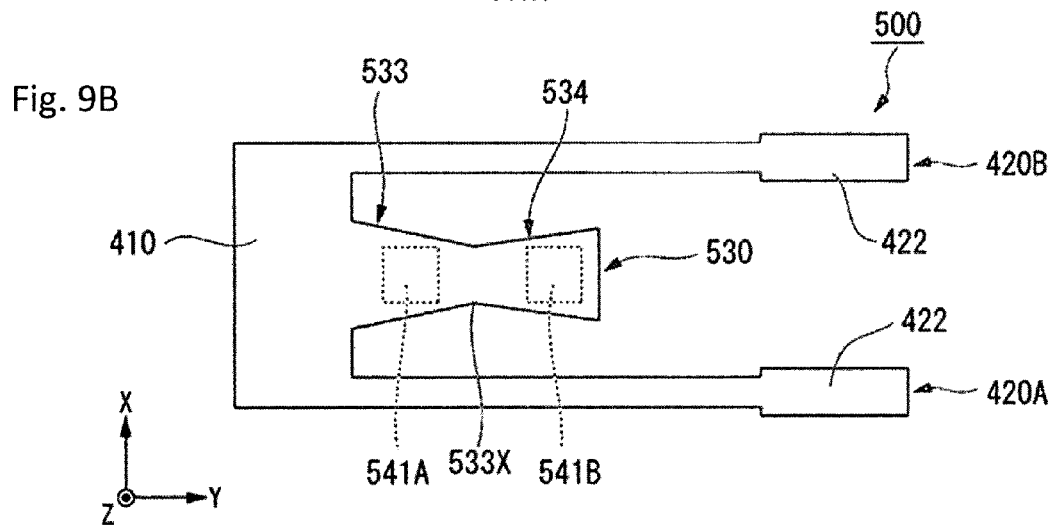
FIG. 9B is a plan view illustrating a piezoelectric vibration piece according to Modification Example 1 of the second embodiment.

FIG. 9B is a plan view illustrating a piezoelectric vibration piece according to Modification Example 1 of the second embodiment.

As illustrated in FIG. 9B, a support arm portion 530 configuring a piezoelectric vibration piece 500 includes a first arm portion 533, and a second arm portion 534. Mounting portions 541A and 541B are disposed on a principal surface (an XY surface) of the first arm portion 533 and a principal surface (an XY surface) of the second arm portion 534, respectively.

In the piezoelectric vibration piece 500 having such a configuration, even when the conductive adhesive agent (not illustrated) applied to the mounting portion 541A (541B) wet-spreads to the longitudinal direction of the support arm portion 530 (the Y axis direction), is accumulated in a boundary portion 533X, and does not reach the other mounting portion 541B (541A) side, and thus it is possible to prevent a short circuit.

Modification Example 2 of Second Embodiment

Next, Modification Example 2 of the second embodiment described above will be described with mainly reference to FIG. 9C.

Figure 9C:
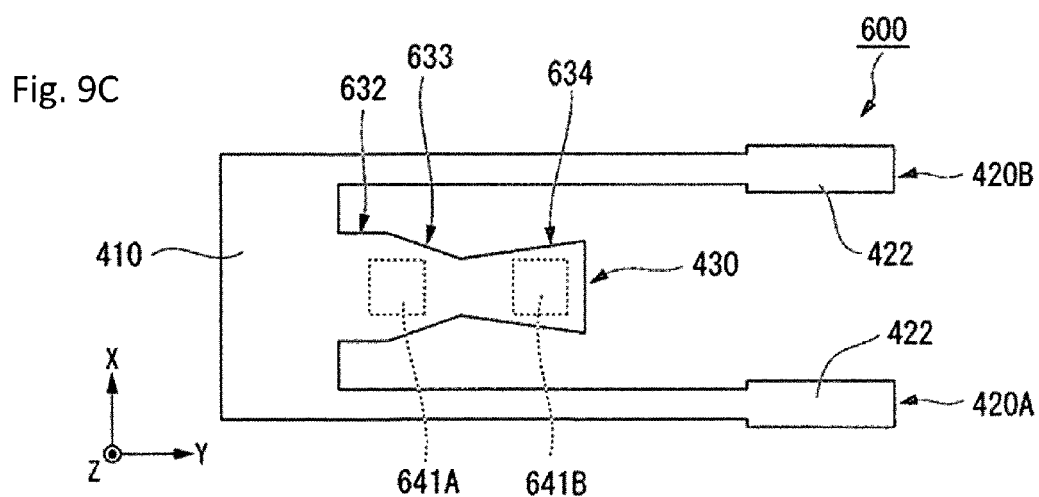
FIG. 9C is a plan view illustrating a piezoelectric vibration piece according to Modification Example 2 of the second embodiment.

FIG. 9C is a plan view illustrating a piezoelectric vibration piece according to Modification Example 2 of the second embodiment.

As illustrated in FIG. 9C, a support arm portion 630 configuring a piezoelectric vibration piece 600 includes an extending arm portion 632 extending from the base portion 410, a first arm portion 633 formed to be connected to the extending arm portion 632, and a second arm portion 634 formed to be connected to the first arm portion 633. A mounting portion 641A is disposed over a principal surface (an XY surface) of the first arm portion 433 from a principal surface (an XY surface) of the extending arm portion 632. In addition, a mounting portion 641B is disposed on a principal surface (an XY surface) of the second arm portion 434.

As described above, the examples of the preferred embodiments according to the present invention are described with reference to the attached drawings, but the present invention is not limited to these examples. Various shapes or combinations of the respective constituents in the examples described above are an example, and are able to be variously changed on the basis of a design request without deviating from the gist of the present invention.

For example, in the embodiments described above, the both side surfaces 133S and 133T of the first arm portion 133 and the both side surfaces 134S and 134T of the second arm portion 134 are formed in the shape of a flat surface, but the present invention is not limited thereto. The side surface of the first arm portion and the side surface of the second arm portion may be formed in the shape of a curved surface, and thus the first arm portion may be formed such that the width is gradually narrowed towards the tip end portion side, and the second arm portion may be formed such that the width is gradually broadened towards the tip end portion side.

What is claimed is:
1. A piezoelectric vibration piece, comprising:
 a base portion;
 a pair of vibration arm portions extending in a first direction from the base portion, and separated in a second direction orthogonal to the first direction; and
 a support arm portion extending in the first direction from the base portion,
 wherein the support arm portion, includes
 a first support arm portion having a width along the second direction that gradually narrows towards a tip end portion to a minimum at an inflection point of the support arm portion, and
 a second support arm portion that extends in the first direction from the first arm portion and having a width along the second direction that gradually broadens towards the tip end portion from the inflection point,
 wherein the base portion further includes base end arm portions and the support arm portion includes an extending arm portion extending from the base end arm portion to the first support arm portion, and an etching residue resides on a side surface of the extending arm portion.

2. The piezoelectric vibration piece according to claim 1, wherein side surfaces of the first support arm portion and the second support arm portion are flat surfaces.

3. The piezoelectric vibration piece according to claim 1, wherein the support arm portion includes a tip end arm portion extending in the first direction from the second arm portion and having a constant width.

4. The piezoelectric vibration piece according to claim 1, wherein a boundary portion resides between the first support arm portion and the second support arm portion, wherein the first support arm portion and the second support arm portion are symmetrical with respect to the boundary portion.

5. The piezoelectric vibration piece according to claim 1, wherein one side surface of the first support arm portion and the second support arm portion each have a flat surface that extends in the first direction parallel to the vibration arm portions, and a first opposite side surface of the first and second support arm portions that has a flat surface that extends gradually closer to the one side surface of the first and second support arm portions in the second direction and toward the inflection point, and
a second opposite side surface of the first and second support arm portions has a flat surface that gradually separates from the one side surface of the first and second support arm portions in the first direction and away from an inflection point.

6. The piezoelectric vibration piece according to claim 1, wherein a change rate of the width of the second support arm portion along the first direction is greater than a change rate of the width of the first arm support portion along the first direction.

7. A piezoelectric vibrator, comprising:
a package including a base member and a lid member joined to the base member in an overlapping manner and defining a hermetically sealed cavity between the base member and the lid member; and
the piezoelectric vibration piece according to claims 1 mounted on a mounting surface of the base member and contained within the cavity.

* * * * *